United States Patent
Kobayashi et al.

(10) Patent No.: US 9,114,428 B2
(45) Date of Patent: Aug. 25, 2015

(54) PIEZOELECTRIC ELEMENT MODULE, ULTRASONIC TRANSDUCER, ULTRASONIC DEVICE, LIQUID EJECTING HEAD, LIQUID EJECTING APPARATUS, AND PIEZOELECTRIC ELEMENT MODULE MANUFACTURING METHOD

(71) Applicant: SEIKO EPSON CORPORATION, Tokyo (JP)

(72) Inventors: Tomokazu Kobayashi, Shiojiri (JP); Tsutomu Nishiwaki, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/223,293

(22) Filed: Mar. 24, 2014

(65) Prior Publication Data

US 2014/0292941 A1    Oct. 2, 2014

(30) Foreign Application Priority Data

Mar. 28, 2013   (JP) .................. 2013-070722

(51) Int. Cl.
   *B41J 2/045*   (2006.01)
   *B06B 1/06*    (2006.01)
   *B41J 2/14*    (2006.01)
   *B41J 2/16*    (2006.01)

(52) U.S. Cl.
   CPC ......... *B06B 1/0629* (2013.01); *B41J 2/14233* (2013.01); *B41J 2/161* (2013.01); *B41J 2/1623* (2013.01); *B41J 2/1628* (2013.01); *B41J 2/1629* (2013.01); *B41J 2/1634* (2013.01); *B41J 2/1642* (2013.01); *B41J 2/1643* (2013.01); *B41J 2/1646* (2013.01); *B41J 2002/14241* (2013.01); *B41J 2002/14419* (2013.01)

(58) Field of Classification Search
   CPC ... B41J 2/14201; B41J 2/14233; H01L 41/18; H01L 41/0926; H01L 41/22
   See application file for complete search history.

(56) References Cited

U.S. PATENT DOCUMENTS 7,527,363 B2 * 5/2009 Nagashima .................. 347/70
2010/0202253 A1  8/2010 Nakamura

FOREIGN PATENT DOCUMENTS

JP  2010-183437  8/2010
JP  2011-082624  4/2011

* cited by examiner

*Primary Examiner* — Geoffrey Mruk
(74) *Attorney, Agent, or Firm* — Workman Nydegger

(57) ABSTRACT

A first piezoelectric element having a first piezoelectric layer and a second piezoelectric element having a second piezoelectric layer, which is different from the first piezoelectric layer, are included on the same substrate. The first piezoelectric layer has a d constant greater than a d constant of the second piezoelectric layer.

10 Claims, 8 Drawing Sheets

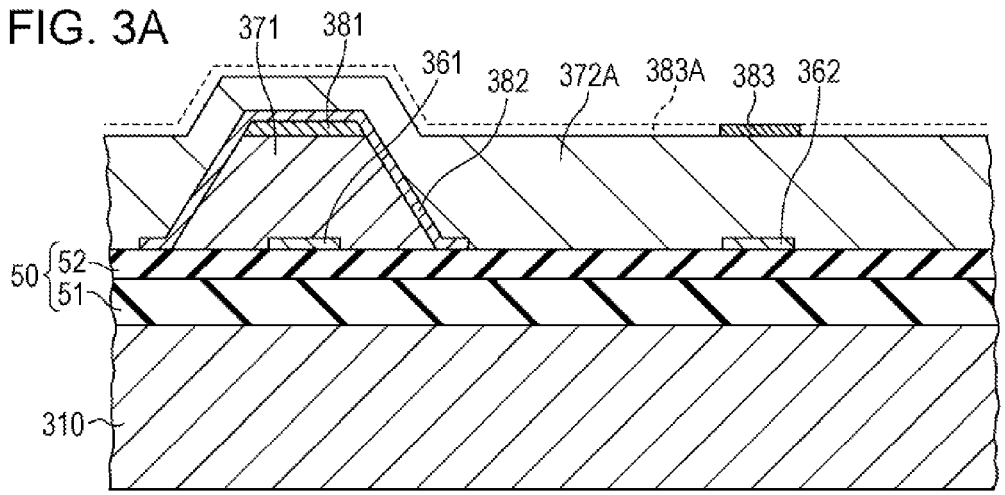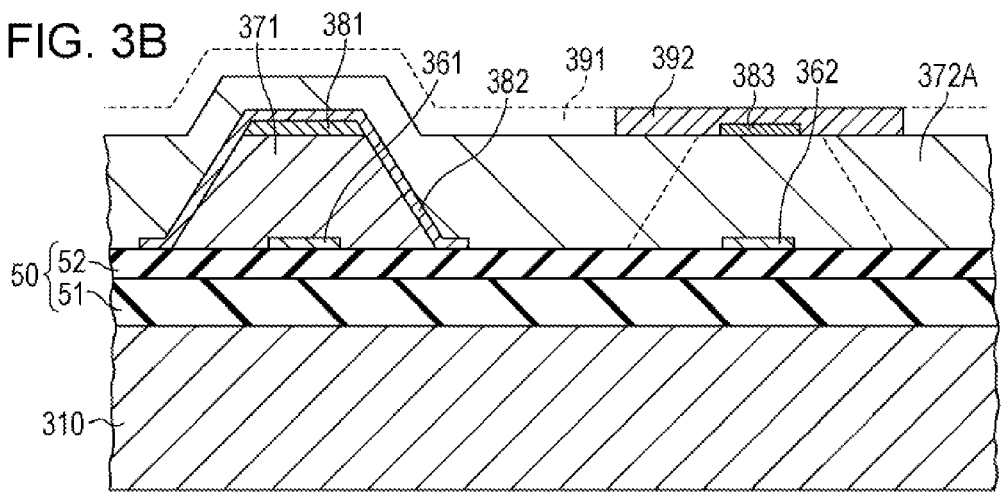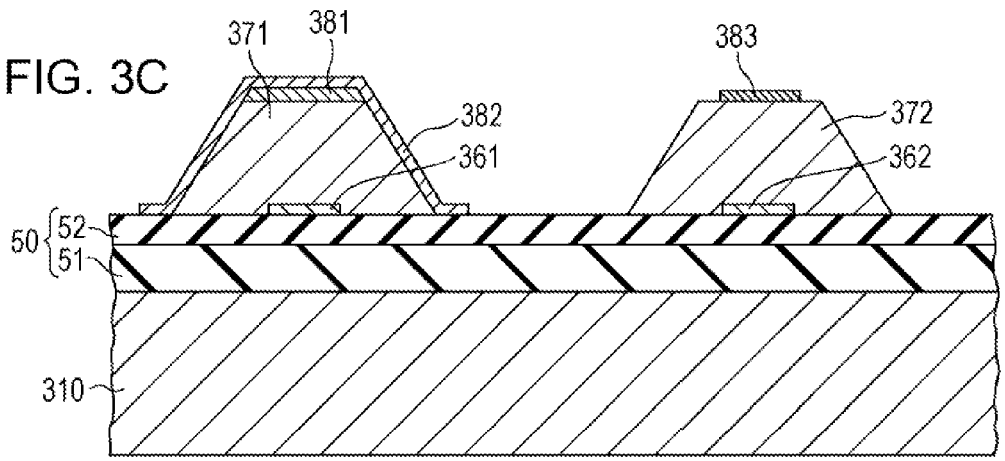

PIEZOELECTRIC ELEMENT MODULE, ULTRASONIC TRANSDUCER, ULTRASONIC DEVICE, LIQUID EJECTING HEAD, LIQUID EJECTING APPARATUS, AND PIEZOELECTRIC ELEMENT MODULE MANUFACTURING METHOD

BACKGROUND

1. Technical Field

The present invention relates to a piezoelectric element module, an ultrasonic transducer, a liquid ejecting head, a liquid ejecting apparatus, and a piezoelectric element module manufacturing method.

2. Related Art

Ultrasonic sensors, which are exemplary ultrasonic devices including ultrasonic transducers using piezoelectric elements, include two types, integrated transmitter/receiver ultrasonic sensors and separate transmitter/receiver ultrasonic sensors. Guidelines for selecting a piezoelectric element are that, at the time of transmitting ultrasonic waves, it is important that the amplitude vibration upon application of voltage is large, that is, a piezoelectric constant $d_{33}$ is large, whereas, at the time of receiving ultrasonic waves, it is desirable that the voltage generated upon application of pressure be large, that is, a piezoelectric voltage constant $g_{33}$ be large.

Lead zirconate titanate (PZT) having a composition of a morphotropic phase boundary (MPB) at which the piezoelectric constant $d_{33}$ is large has been used as an element. However, although such a PZT is excellent in terms of transmission performance, there has been a problem in that, since PZT has a large relative dielectric constant, the piezoelectric voltage constant $g_{33}$ is small and the reception performance is inferior.

To address this problem, for example, an ultrasonic sensor that aims to improve performances by optimizing the arrangement pattern of units in a separate transmitter/receiver structure has been proposed (see JP-A-2010-183437). Another ultrasonic sensor that reduces sound diffraction and residual vibration by providing a gap between units in a separate transmitter/receiver structure has been proposed (see JP-A-2011-82624).

However, the ultrasonic sensors disclosed in JP-A-2010-183437 and JP-A-2011-82624 have not yet attained sufficient sensitivity. Sensors with more satisfactory sensitivity have been desired.

Note that, both in JP-A-2010-183437 and in JP-A-2011-82624, piezoelectric elements of the transmitting unit and the receiving unit are the same, and different piezoelectric elements are not provided to the transmitting unit and the receiving unit probably because it is difficult to manufacture an ultrasonic sensor with such a configuration.

SUMMARY

An advantage of some aspects of the invention is that it provides a piezoelectric element module, an ultrasonic transducer, an ultrasonic device, a liquid ejecting head, a liquid ejecting apparatus, and a piezoelectric element module manufacturing method that can improve the sensitivity of both a transmitting unit and a receiving unit.

An aspect of the invention lies in a piezoelectric element module including a first piezoelectric element having a first piezoelectric layer, and a second piezoelectric element having a second piezoelectric layer different from the first piezoelectric layer, the first piezoelectric element and the second piezoelectric element being on the same substrate. In the piezoelectric element module, the first piezoelectric layer has a d constant greater than a d constant of the second piezoelectric layer. According to such an aspect, the piezoelectric elements having different characteristics in such a manner that the d constant of the first piezoelectric layer is greater than the d constant of the second piezoelectric layer are provided on the same substrate. This enables an ultrasonic transducer to have improved sensitivity both in a transmitting unit and a receiving unit, and also enables a liquid ejecting head to separately eject droplets having different sizes if the drive waveforms are the same.

Here, it is preferable that the first piezoelectric element and the second piezoelectric element be arranged side by side in the same plane. According to this, piezoelectric elements of two types are arranged side by side in the same plane, and thus can be applied to various uses.

Another aspect lies in an ultrasonic transducer including the piezoelectric element module according to the above aspect. In the ultrasonic transducer, the first piezoelectric layer has a g constant smaller than a g constant of the second piezoelectric layer, the first piezoelectric element is a transmitting unit, and the second piezoelectric element is a receiving unit. According to such an aspect, an ultrasonic transducer having improved sensitivity both in the transmitting unit and in the receiving unit can be realized.

Another aspect lies in an ultrasonic device including a substrate having an opening and the ultrasonic transducer according to the above aspect provided on the substrate. According to such an aspect, an ultrasonic transducer having improved sensitivity both in the transmitting unit and the receiving unit can be realized.

Another aspect lies in a liquid ejecting head including a flow path forming substrate having therein a pressure generating chamber communicating with a nozzle opening that ejects liquid, and the piezoelectric element module according to the above aspect provided on the flow path forming substrate. According to such an aspect, a liquid ejecting head that can separately eject droplets having different sizes if the drive waveforms are the same is realized.

Another aspect lies in a liquid ejecting apparatus including the liquid ejecting head according to the above aspect. According to such an aspect, a liquid ejecting head that can separately eject droplets having different sizes if the drive waveforms are the same is realized.

Another aspect lies in a method for manufacturing a piezoelectric element module including a first piezoelectric element having a first piezoelectric layer, and a second piezoelectric element having a second piezoelectric layer different from the first piezoelectric layer, the first piezoelectric element and the second piezoelectric element being on the same substrate. In the piezoelectric element module, the first piezoelectric layer has a d constant greater than a d constant of the second piezoelectric layer. The method includes patterning a first electrode of a first one of the first piezoelectric element and the second piezoelectric element as an individual electrode, applying and patterning a piezoelectric layer of the first one of the first piezoelectric element and the second piezoelectric element, providing a second electrode of the first one of the first piezoelectric element and the second piezoelectric element as a common electrode, patterning a first electrode of a second one of the first piezoelectric element and the second piezoelectric element as an individual electrode, applying and patterning a piezoelectric layer of the second one of the first piezoelectric element and the second piezoelectric element, and providing a second electrode of the second one of the first piezoelectric element and the second piezoelectric element as a common electrode. According to such an aspect, piezoelectric elements of different types can be arranged side by side on the same substrate.

BRIEF DESCRIPTION OF THE DRAWINGS

The invention will be described with reference to the accompanying drawings, wherein like numbers reference like elements.

FIG. 3A to FIG. 3C are sectional views illustrating manufacturing processes of the piezoelectric element module.

DESCRIPTION OF EXEMPLARY EMBODIMENTS

Figure 1A:
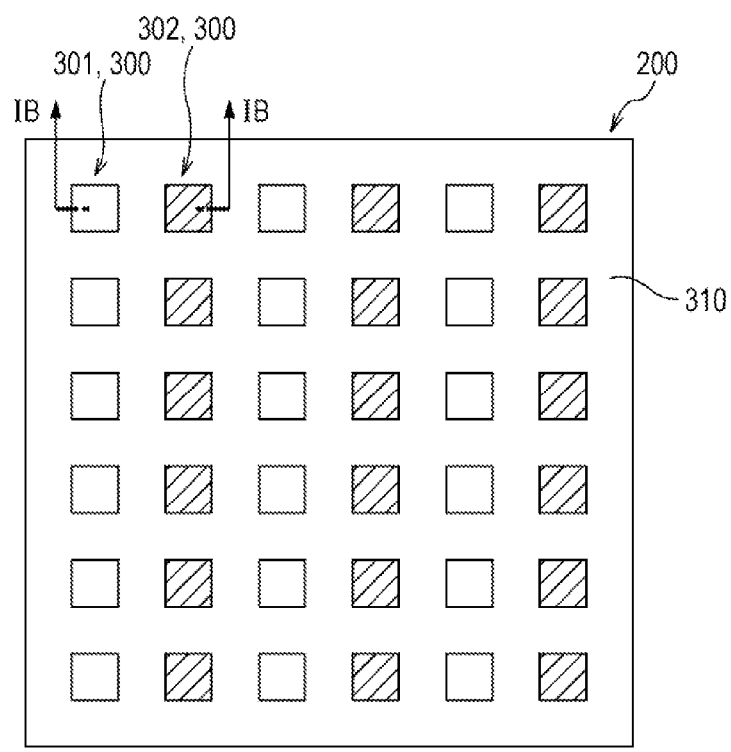
FIG. 1A is a plan view illustrating a schematic structure of an ultrasonic device according to an embodiment.
Figure 1B:
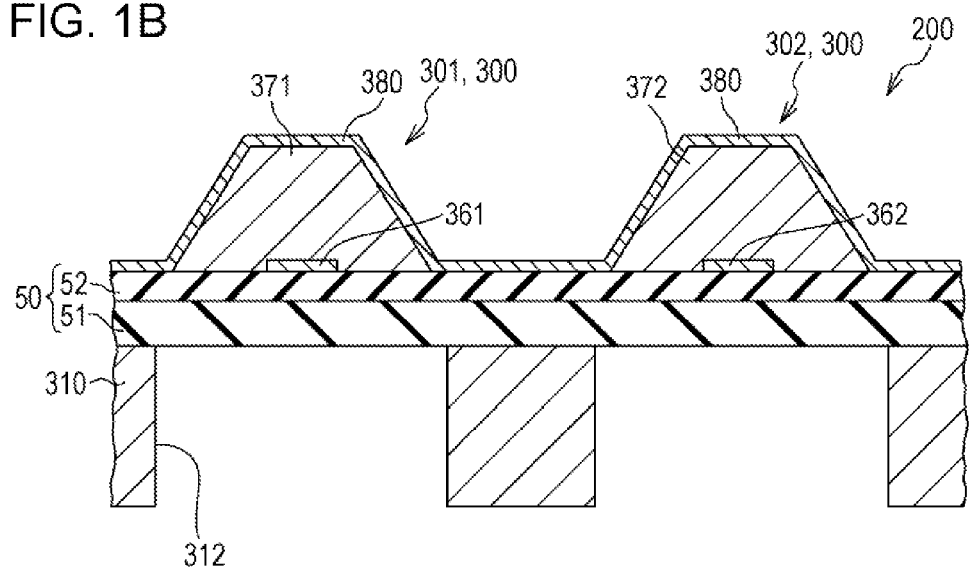
FIG. 1B is a sectional view taken along the line IB-IB' in FIG. 1A.

Hereinafter, the invention will be described in detail on the basis of an embodiment. FIG. 1A is a plan view of an ultrasonic device on which an ultrasonic transducer according to one embodiment of the invention is mounted, and FIG. 1B is a sectional view taken along the line IB-IB' in FIG. 1A.

As illustrated in FIG. 1A, in an ultrasonic device 200, a plurality of transmitter ultrasonic transducers 301 and a plurality of receiver ultrasonic transducers 302, which are provided in the form of an array in the regions of substrate openings 312 of a substrate 310, together form an array sensor. The plurality of transmitter ultrasonic transducers 301 and the plurality of receiver ultrasonic transducers 302 are arranged alternately column by column, and energization is switched for each of the transducer columns. In response to energization switching in such a manner, line scanning and sector scanning are implemented. The levels of output and input of ultrasonic waves are determined in accordance with the number of energized transducers and the number of energized columns. In the drawing, an array of only six rows and six columns is represented for the sake of simplicity. The number of rows and the number of columns of an arrangement are determined in accordance with the scanning range.

Note that the transmitter ultrasonic transducers 301 and the receiver ultrasonic transducers 302 may be arranged alternately for each transducer. In this case, alignment of directional angles of transmission and reception is facilitated by providing an ultrasonic transmitting and receiving device in which the central axes of transmitter transducers and receiver transducers are aligned with each other.

In this embodiment, in order to reduce the size of the device, a piezoelectric element module in which both the transmitter ultrasonic transducer 301 and the receiver ultrasonic transducer 302 are arranged on a single substrate 310 is used. Piezoelectric elements that are most suitable for the transmitter ultrasonic transducer 301 and the receiver ultrasonic transducer 302 are used for the transmitter ultrasonic transducer 301 and the receiver ultrasonic transducer 302, respectively, details of which will be described later.

In FIG. 1B, as an embodiment that can be used as an ultrasonic transducer, for example, the substrate 310 is made of single crystal silicon having a (100), (110), or (111) orientation. Besides silicon materials, ceramic materials typified by $ZrO_2$ or $Al_2O_3$, glass ceramic materials, oxide substrate materials such as MgO and $LaAlO_3$, inorganic materials such as SiC, $SiO_2$, polycrystalline silicon, and $Si_3N_4$ can be used. In addition, a laminated body made of a combination of these materials may be used.

A diaphragm 50 is formed above the substrate 310. The diaphragm 50 includes an oxide layer 51 that is made of an oxide, for example, silicon dioxide, and is formed on the substrate 310, and a zirconium dioxide layer 52 that is made of zirconium dioxide ($ZrO_2$) and is formed on the oxide layer 51 by a liquid phase method. Note that the thickness of the diaphragm 50 is determined on the basis of the resonance frequency.

The transmitter ultrasonic transducer 301 and the receiver ultrasonic transducer 302 are disposed on the diaphragm 50.

The transmitter ultrasonic transducer 301 includes a first electrode 361, which serves as an individual electrode patterned for each of the transmitter ultrasonic transducers 301, a piezoelectric layer 371, and a second electrode 380 serving as a common electrode.

In contrast, the receiver ultrasonic transducer 302 includes a first electrode 362, which serves as an individual electrode patterned for each of the receiver ultrasonic transducers 302, a piezoelectric layer 372, and the second electrode 380 serving as the common electrode.

Here, the piezoelectric layer 371 is made of a piezoelectric material having a d constant greater than that of the second piezoelectric layer 372 and having a relative dielectric constant greater than that of the piezoelectric layer 372. An oxide having a perovskite structure containing lead (Pb), titanium (Ti), and zirconium (Zr) is preferable as such a material, and the piezoelectric layer 371 in this embodiment is made of lead zirconate titanate (PZT; Zr/Ti=52/48 composition).

In contrast, the piezoelectric layer 372 is made of a piezoelectric material having a d constant smaller than that of the piezoelectric layer 371 and having a relative dielectric constant smaller than that of the piezoelectric layer 371. As such a piezoelectric material, an oxide having a perovskite structure containing bismuth (Bi) and iron (Fe), an oxide having a perovskite structure containing bismuth (Bi), lanthanum (La), and iron (Fe), an oxide having a perovskite structure containing bismuth (Bi), barium (Ba), iron (Fe), and titanium (Ti), an oxide having a perovskite structure containing potassium (K), sodium (Na), and niobium (Nb), and an oxide having a perovskite structure containing elements, such as manganese (Mn), in addition to these elements are preferable. In particular, $BiFeO_3$-based materials, such as $BiLaFeMnO_3$ and BiFeMn—$BaTiO_3$, $KNaNbO_3$-based materials, and so forth are preferable. In addition, lead zirconate titanate (PZT; Zr/Ti=30/70 composition) and so forth may be used. In this embodiment, BiFeMn—$BaTiO_3$ is used.

In such a configuration, in the transmitter ultrasonic transducer 301 that operates at the time of transmitting ultrasonic waves and in which the amplitude vibration upon application of voltage is large, the piezoelectric constant $d_{33}$ of the piezoelectric layer 371 is large. Thus, the transmitter ultrasonic transducer 301 has good sensitivity. In the receiver ultrasonic transducer 302 that operates at the time of receiving ultrasonic waves and in which voltage generated upon application of pressure is large, the piezoelectric layer 372 has a piezoelectric constant $d_{33}$ smaller than that of the piezoelectric layer 371 and has a relative dielectric constant significantly smaller than that of the piezoelectric layer 371, and, as a result, the piezoelectric layer 372 has a piezoelectric voltage constant $g_{33}$ greater than that of the piezoelectric layer 371. Thus, the receiver ultrasonic transducer 302 has good sensitivity. From such a viewpoint, it is preferable that a material having as small a relative dielectric constant as possible be used as the piezoelectric layer 372 of the receiver ultrasonic transducer 302. As a result, a material having a piezoelectric voltage constant $g_{33}$ greater than that of the piezoelectric layer 371 needs to be used.

The material of the first electrodes 361 and 362 needs to be a material that does not oxidize when the piezoelectric layers 371 and 372 are formed, so that conductivity can be maintained. For example, a noble metal such as platinum (Pt) or a conductive oxide typified by lanthanum nickel oxide (LNO) is preferably used. In this embodiment, although not illustrated in the drawing, an adhesion layer made up of zirconium, titanium, and titanium oxide may be provided as a foundation for the first electrode 361.

The piezoelectric layer 371 and the piezoelectric layer 372, which are made of such materials as described above, are both formed by a liquid phase method. The piezoelectric layer 371 is first formed and then is patterned, and thereafter the piezoelectric layer 372 is provided. When the piezoelectric layer 371 is patterned, it is desirable, in order to prevent degradation of the piezoelectric layer 371, that patterning be performed under the condition that a thin conductor layer made of platinum or the like is provided. Additionally, in this embodiment, in order to protect the piezoelectric layer 371 when the piezoelectric layer 372 is later provided, after patterning is performed under the condition that a conductor layer made of platinum or the like is provided so as to cover the piezoelectric layer 371, the piezoelectric layer 372 may be provided. The conductor layer provided here may be shared with the first electrode 361.

According to such a patterning method, since the piezoelectric layer 371 is fired again when the piezoelectric layer 372 is fired, it is desirable that the firing temperature for the piezoelectric layer 371 be higher than that for the piezoelectric layer 372. Accordingly, it is desirable to discuss which of the piezoelectric layers 371 and 372 is to be formed first, depending on the materials used for them.

Note that the piezoelectric layer 371 and the piezoelectric layer 372 can be formed by a physical vapor deposition (PVD) method (a gas phase process), such as sputtering or a laser ablation method, instead of the liquid phase method.

Additionally, in order to improve the sensitivity of the transmitter ultrasonic transducer 301 and the receiver ultrasonic transducer 302, it is desirable that the piezoelectric layers 371 and 372 be oriented in a predetermined plane, particularly in a (100) plane, and it is also desirable that a seed layer, an orientation control film, and so forth be provided as a foundation of the piezoelectric layers 371 and 372. In this embodiment, in order to control the orientation of the piezoelectric layer 371 made of PZT, it is desirable that an orientation control film made up of seed titanium and LNO ($LaNiO_3$) be provided. Additionally, in this embodiment, it is desirable that, as the foundation of the piezoelectric layer 372 made of $BiFeMn$—$BaTiO_3$, a seed layer and an orientation control layer made up of LNO, an oxide containing Bi and Mn, such as $BiMnO_3$, and an oxide having a perovskite structure containing Bi, Fe, and Ti, such as $BiFeTiO_3$, be provided.

Additionally, in addition to the way in which the piezoelectric layers 371 and 372 are sequentially provided by the patterning method mentioned above, the piezoelectric layers 371 and 372 may be provided in such a way that they are separately printed using an ink jet method, which is inferior in accuracy to patterning.

The second electrode 380 is a common electrode of the transmitter ultrasonic transducer 301 and the receiver ultrasonic transducer 302, such that the second electrode 380 is shared by the transmitter ultrasonic transducer 301 and the receiver ultrasonic transducer 302. However, the transmitter ultrasonic transducer 301 and the receiver ultrasonic transducer 302 may be provided with their respective separate common electrodes. For the second electrode 380, a material that can form a good interface between the second electrode 380 and the piezoelectric layers 371 and 372 and that can exhibit insulating properties and piezoelectric characteristics is desirable. Noble metal materials such as iridium (Ir), platinum (Pt), palladium (Pd), and gold (Au) and conductive oxides typified by lanthanum nickel oxide (LNO) are preferably used. Additionally, the second electrode 380 may be a laminate of a plurality of materials. The second electrode 380 can be formed by a physical vapor deposition (PVD) method (a gas phase process), such as sputtering or a laser ablation method, or a liquid phase method, such as a sol-gel process or plating.

In this embodiment, substrate openings 312 are formed in the substrate 310. The substrate openings 312 can be formed using a processing method such as etching, grinding, or laser processing in accordance with the substrate material. In the case where a silicon substrate is used, it is desirable that anisotropic wet etching be used.

The ultrasonic device 200 described above includes a piezoelectric module in which the piezoelectric elements 300 that are suitable for the transmitting unit and the receiving unit, respectively, are arranged, and therefore can exhibit maximum performance. Moreover, it is possible to form a piezoelectric element module in the same wafer by a simple process. This makes it easy to arrange the transmitting unit and the receiving unit so that they are next to each other, and also improves the accuracy of detection of a target object.

Specifically, the transmitter ultrasonic transducer 301 and the receiver ultrasonic transducer 302 are both arranged next to each other in a side-by-side fashion in the same plane on the substrate 310. The transmitter ultrasonic transducer 301 and the receiver ultrasonic transducer 302 are arranged alternately for each transducer in this manner, so that an ultrasonic transmitting and receiving device in which the central axes of transmitter transducers and receiver transducers are aligned with each other is provided, thereby facilitating alignment of directional angles of transmission and reception.

As such, in the ultrasonic device of this application, piezoelectric elements produced using MEMS technology can be arranged at narrow pitches (high resolution) and the driving voltage is low, compared with a sensor utilizing a bulk-type piezoelectric ceramic. Therefore, the ultrasonic device of this application has advantages in terms of size reduction, thickness reduction, and energy saving. Additionally, variations among the produced piezoelectric elements are small. This brings about the effect of increasing the sensor accuracy.

Furthermore, the thicknesses of the piezoelectric layers 371 and 372 are reduced, so that the deformation characteristic is improved. Thereby, the effect of improving the efficiency of transmission and reception of ultrasonic waves is obtained.

Next, an example of a method for manufacturing the piezoelectric element module used in the ultrasonic device 200 described above will be described with reference to FIG. 2A to FIG. 4B.

Figure 2A:
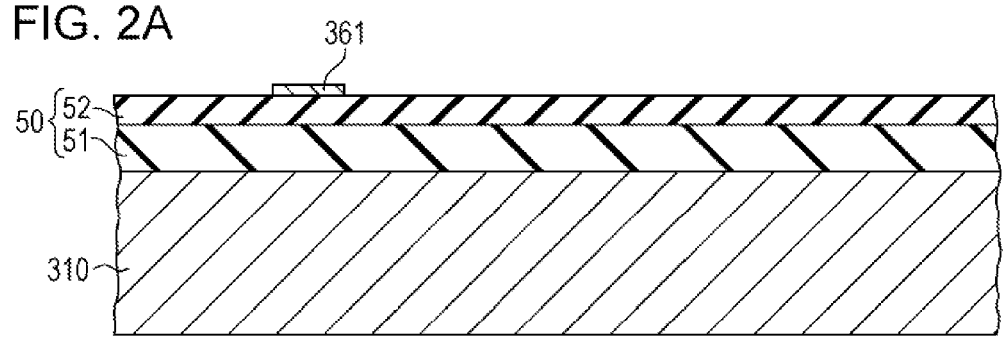
FIG. 2A to FIG. 2C are sectional views illustrating manufacturing processes of a piezoelectric element module.

As illustrated in FIG. 2A, after the oxide layer 51 made of a silicon oxide and the zirconium dioxide layer 52 are provided on the substrate 310, a conductor layer made of platinum or the like is provided and patterned, so that the first electrode 361 is provided.

Figure 2B:
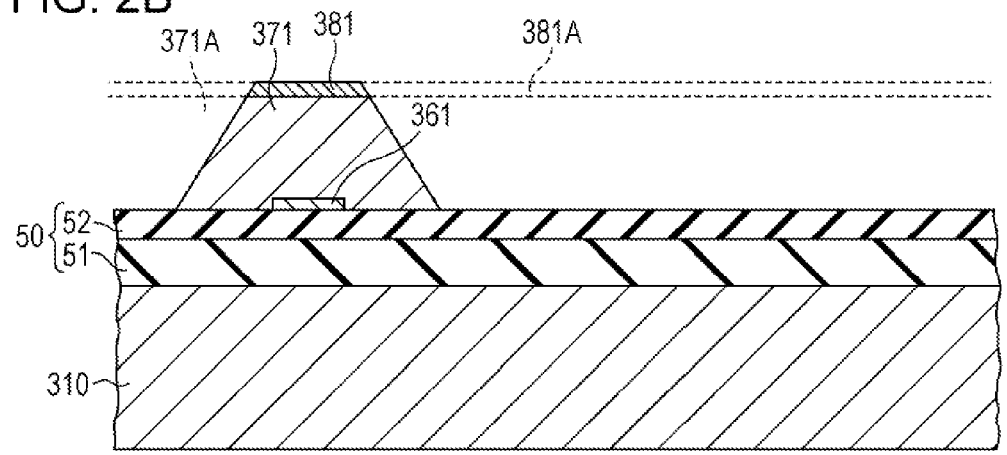

Then, as illustrated in FIG. 2B, after seed titanium or the like is provided if needed, a piezoelectric precursor layer is applied by a liquid phase method, and drying, degreasing, and firing are performed, so that the piezoelectric layer 371A is formed. Additionally, after a thin first conductor layer 381A made of platinum is provided, the piezoelectric layer 371A and the first conductor layer 381A are patterned. Thus, the piezoelectric layer 371 and the first conductor layer 381 are formed.

Here, the piezoelectric precursor layer can be formed using a liquid phase method such as an MOD method or a sol-gel method, or a gas phase method such as a laser ablation method, a sputtering method, a pulsed laser deposition (PLD) method, a CVD method, or an aerosol deposition method. Patterning of the piezoelectric layer 371A and the first conductor layer 381A can be performed by dry etching or the like.

Note that a piezoelectric layer composed of a plurality of piezoelectric material films may be formed by repeating the application process, the drying process, and the degreasing process, and the application process, the drying process, the degreasing process, and the firing process a plurality of times in accordance with a desired film thickness and so forth.

Figure 2C:
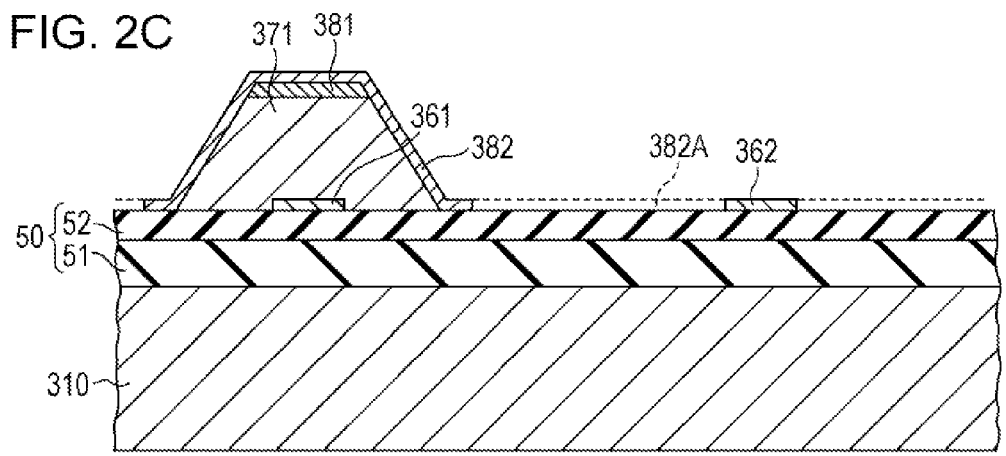

Next, as illustrated in FIG. 2C, after a second conductor layer 382A is provided over the entire substrate 310, patterning is performed, so that the second conductor layer 382 covering the piezoelectric layer 371 and the first electrode 362 are formed. Here, the second conductor layer 382 is a layer for protecting the piezoelectric layer 371 when the piezoelectric layer 372 of the receiver ultrasonic transducer 302 is provided. Additionally, the second conductor layer 382, together with the first conductor layer 381, serves as the second electrode 380 of the transmitter ultrasonic transducer 301. Furthermore, although the first electrode 362 of the receiver ultrasonic transducer 302 is provided together with the second conductor layer 382 in this example, the first electrode 362 may be provided separately. Note that, from such a viewpoint, the second conductor layer 382A needs to have durability to withstand the temperature at which the piezoelectric layer 372 is fired. Therefore, it is desirable that the second conductor layer 382A be made of platinum, for example.

Next, as illustrated in FIG. 3A, after an orientation control layer is provided if needed, a piezoelectric precursor layer is applied by a liquid phase method, and drying, degreasing, and firing are performed, so that a piezoelectric layer 372A is formed. Additionally, on top of the piezoelectric layer 372A, a third conductor layer 383A is formed and is patterned, so that a third conductor layer 383 is provided at a position corresponding to the receiver ultrasonic transducer 302. Although the third conductor layer 383 is a layer for protecting the piezoelectric layer 372 of the receiver ultrasonic transducer 302, the third conductor layer 383 may be removed.

Then, as illustrated in FIG. 3B, a resist layer 391 is provided and is patterned, so that a mask 392 for patterning the receiver ultrasonic transducer 302 by wet etching is formed.

Subsequently, as illustrated in FIG. 3C, with the mask 392, the piezoelectric layer 372A is patterned, so that the piezoelectric layer 372 is formed.

Figure 4A:
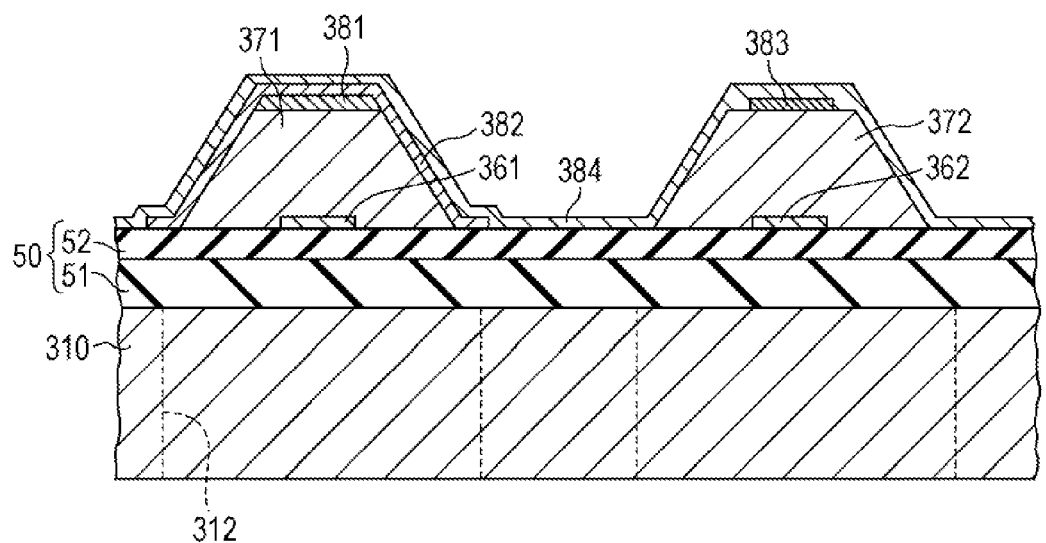
FIG. 4A and FIG. 4B are sectional views illustrating manufacturing processes of the piezoelectric element module.
Figure 4B:
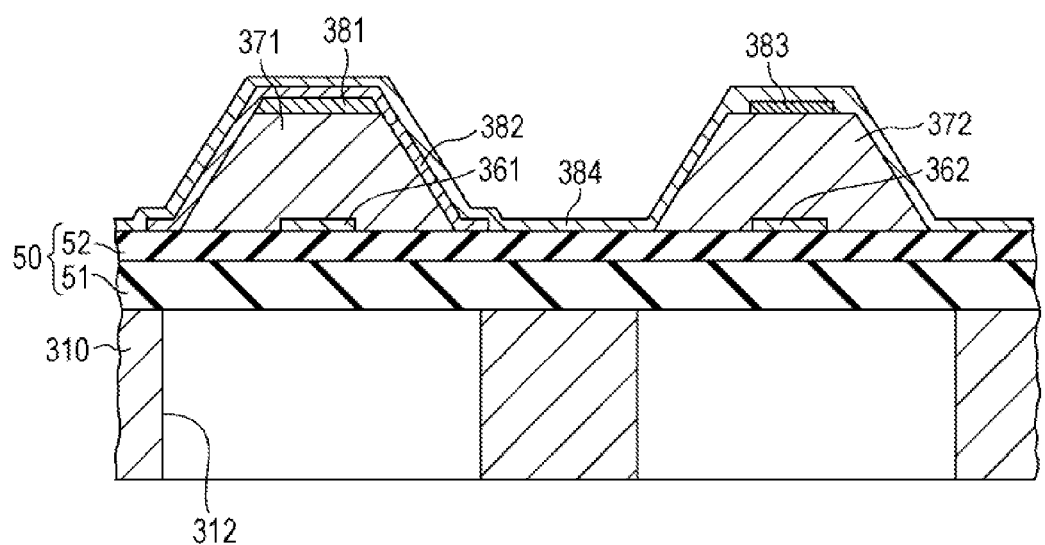

Thereafter, as illustrated in FIG. 4A, a fourth conductor layer 384 constituting the principal part of the second electrode 380 is provided, and then, as illustrated in FIG. 4B, the substrate openings 312 are provided in the substrate 310 by anisotropic wet etching.

In this way, patterning for the piezoelectric layer 372 of the receiver ultrasonic transducer 302, which is to be formed later among the transmitter ultrasonic transducer 301 and the receiver ultrasonic transducer 302, is performed by wet etching. This makes it possible to arrange the transmitter ultrasonic transducer 301 and the receiver ultrasonic transducer 302 side by side on the substrate 310. Note that which of the transmitter ultrasonic transducer 301 and the receiver ultrasonic transducer 302 is to be formed first is not limited and may be determined in consideration of their materials and processes. However, the piezoelectric layer 371 of a transducer formed earlier, which is the transmitter ultrasonic transducer 301 in this case, is covered with the second conductor layer 382.

In the example described above, regarding the transmitter ultrasonic transducer 301, the second electrode 380 is made up of the first conductor layer 381, the second conductor layer 382, and the fourth conductor layer 384, whereas, regarding the receiver ultrasonic transducer 302, the second electrode 380 is made up of the third conductor layer 383 and the fourth conductor layer 384. However, the first conductor layer 381 and the fourth conductor layer 384 may be removed.

In the case where patterning for the piezoelectric layer 372 of the receiver ultrasonic transducer 302, which is to be formed later among the transmitter ultrasonic transducer 301 and the receiver ultrasonic transducer 302, is performed by wet etching, the wet etching may be performed after dry etching is performed until the second conductor layer 382 is exposed. In addition, it is to be understood that although dry etching is performed for the piezoelectric layer 371 formed earlier in the manufacturing example described above, patterning for the piezoelectric layer 371 may be performed by wet etching.

The piezoelectric element module described by way of an example of the ultrasonic device described above, that is, a piezoelectric element module in which piezoelectric elements including piezoelectric layers having different characteristics are appropriately arranged can be applied to a liquid ejecting head. That is, although, in a related-art liquid ejecting head, droplets having different sizes are separately ejected by changing the driving waveform, a liquid ejecting head that makes it possible to separately form dots of different sizes incapable of being handled by changing the driving waveform and to separately form dots of different sizes under the condition that driving waveforms are the same can be implemented by using the piezoelectric element module described above.

Piezoelectric elements including piezoelectric layers having different characteristics may be arranged alternately or in blocks in a single column of piezoelectric elements, and two columns of piezoelectric elements may be provided on a single substrate in such a manner that piezoelectric elements differ from one column to another.

An example of such a liquid ejecting head will be described below. Since the way to arrange different piezoelectric elements is as described above, this point will not further be described.

Figure 5:
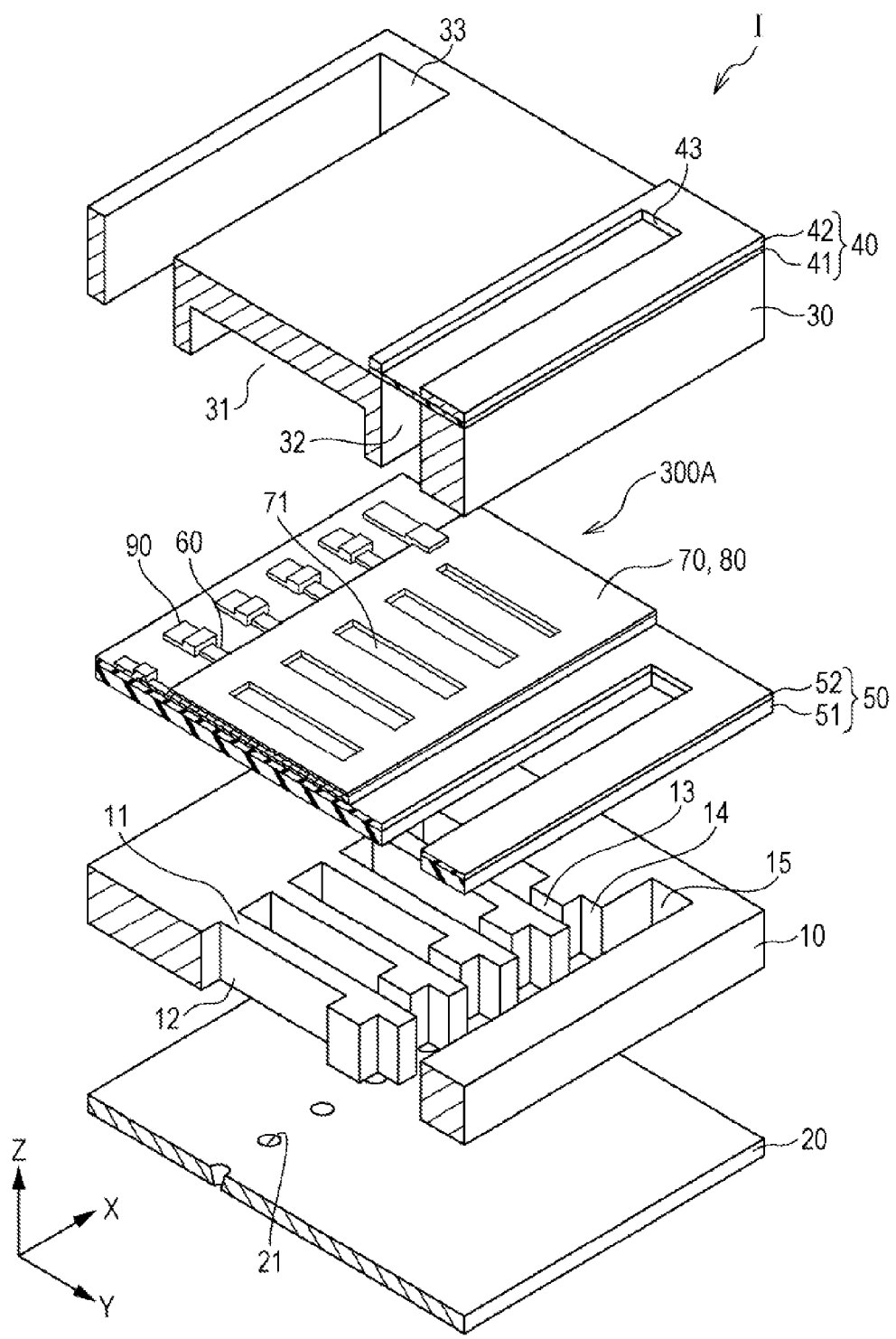
FIG. 5 is an exploded perspective view of a recording head according to the embodiment of the invention.
Figure 6A:
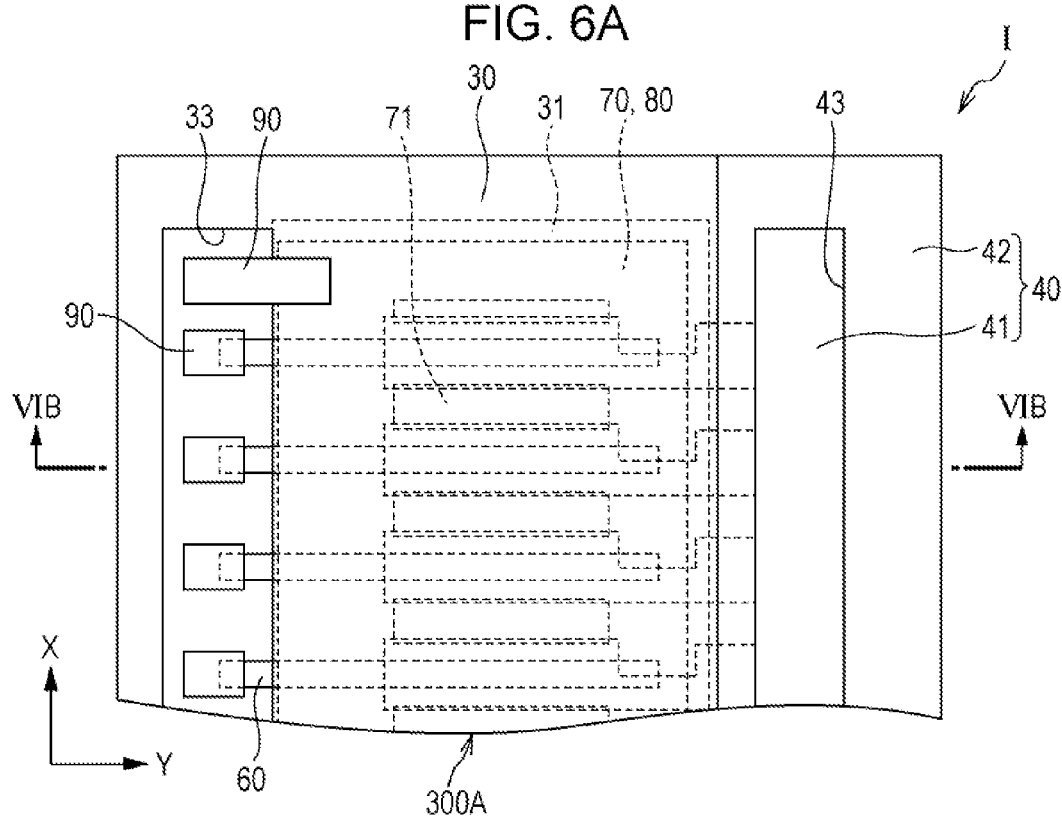
FIG. 6A is a plan view of a recording head according to the embodiment of the invention.
Figure 6B:
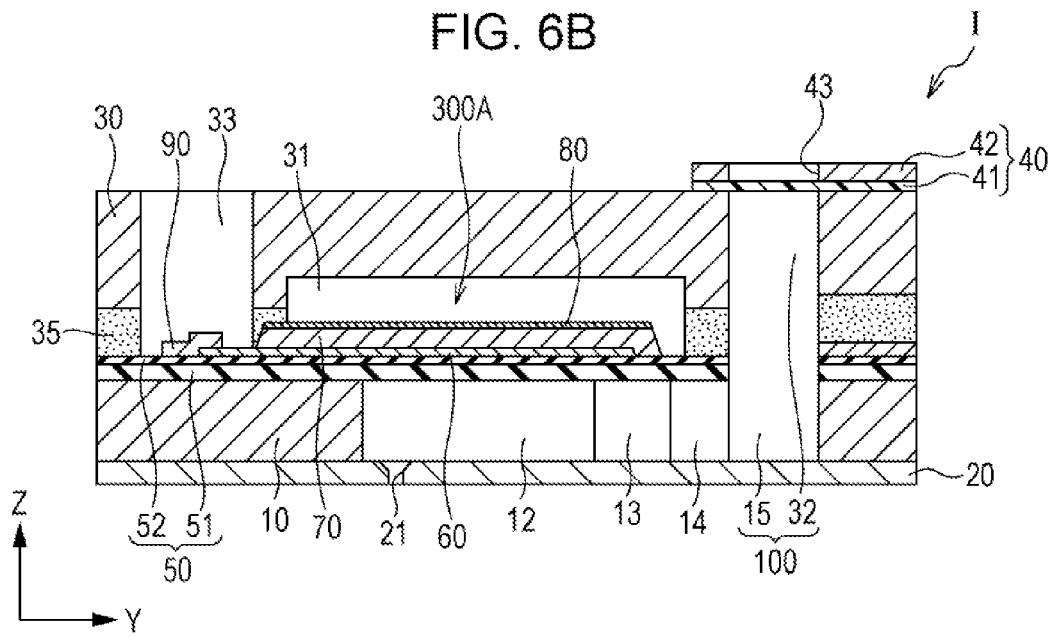
FIG. 6B is a sectional view taken along the line VIB-VIB.
Figure 7:
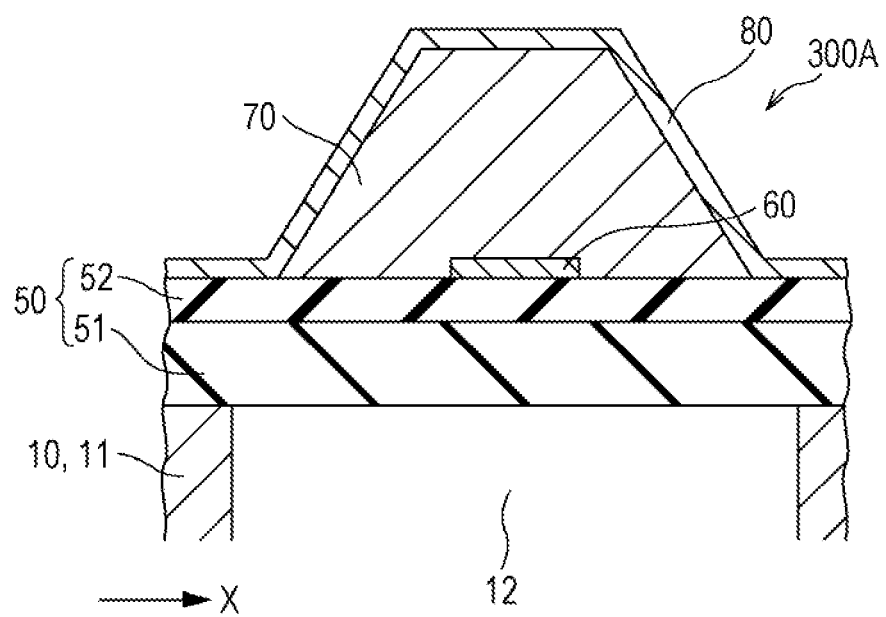
FIG. 7 is an enlarged sectional view of a principal part of the recoding head according to the embodiment of the invention.

FIG. 5 is a perspective view of an ink jet recording head, which is an example of the liquid ejecting head according to one embodiment of the invention, FIG. 6A is a plan view of the ink jet recording head and FIG. 6B is a sectional view taken along the line VIB-VIB' in FIG. 6A, and FIG. 7 is an enlarged sectional view of a principal part in a first direction X.

As illustrated in the drawings, pressure generating chambers 12 are formed in a flow path forming substrate 10 included in an ink jet recording head I, which is an example of the liquid ejecting head of this embodiment. A plurality of pressure generating chambers 12 defined by division-walls 11 are arranged side by side along a direction in which a plurality of nozzle openings 21 that discharge ink of the same color are arranged side by side. Hereinafter, this direction is referred to as a side-by-side direction of the pressure generating chambers 12, or the first direction X. In the flow path forming substrate 10, a plurality of lines which the pressure generating chambers 12 are arranged side by side in the first direction X is provided. (There are two lines in this embodiment. FIGS. 5 and 6 are excerpts of one line in this embodiment.) The line arrangement direction in which a plurality of lines of the pressure generating chambers 12, which are formed along the first direction, are arranged is referred to as a second direction Y hereinafter.

Additionally, ink supply paths 13 and communicating paths 14 are defined by the plurality of division walls 11 on the side of one end in the longitudinal direction of the pressure generating chambers 12 of the flow path forming substrate 10, that is, on the side of one end of the second direction Y perpendicular to the first direction X. Outside the communicating paths 14 (on the side opposite to the pressure generating chambers 12 in the second direction Y), a communicating section 15 constituting part of a manifold 100, which is used as a common ink chamber (liquid chamber) of the pressure generating chambers 12, is formed. That is, a flow path made up of the pressure generating chambers 12, the ink supply paths 13, the communicating paths 14, and the communicating section 15 is provided in the flow path forming substrate 10.

A nozzle plate 20 in which the nozzle openings 21 communicating with the respective pressure generating chambers 12 are drilled is bonded to one surface side of the flow path forming substrate 10, that is, a surface in which the flow path of the pressure generating chambers 12 and so forth is opened, with an adhesive, a thermal weld film, or the like. That is, the nozzle openings 21 are arranged side by side in the first direction X in the nozzle plate 20.

The diaphragm 50 is formed on the other surface side of the flow path forming substrate 10. The diaphragm 50 according to this embodiment, as illustrated in FIG. 6A and FIG. 6B, includes the oxide layer 51 that is made of an oxide and is formed on the flow path forming substrate 10, and the zirconium dioxide layer 52 that is made of zirconium dioxide ($ZrO_2$) and is formed on the oxide layer 51 by a liquid phase method.

On the diaphragm 50, a first electrodes 60, a piezoelectric layer 70, and a second electrode 80 are formed. In this embodiment, a piezoelectric element 300A includes the diaphragm 50, the first electrodes 60, the piezoelectric layer 70, and the second electrode 80. The piezoelectric element 300A provided in a deformable manner on this substrate (the flow path forming substrate 10) is a piezoelectric actuator of this embodiment.

Here, the first electrode 60 constituting the piezoelectric element 300A is isolated for each pressure generating chamber 12, and constitutes an individual electrode that is electrically independent for each active portion described later. The first electrode 60 is formed narrower than the pressure generating chamber 12 in the first direction X of the pressure generating chambers 12. That is, in the first direction X of the pressure generating chambers 12, the ends of the first electrode 60 are positioned inside an area facing the pressure generating chamber 12. In the second direction Y, both ends of the first electrode 60 extend to the outside of the pressure generating chamber 12.

On the side of one end of in the second direction Y of the pressure generating chamber 12 (on the ink supply path side in this embodiment), the end of the piezoelectric layer 70 is positioned outside the end of the first electrode 60. That is, one end of the first electrode 60 is covered with the piezoelectric layer 70. On the side of the other end in the second direction Y of the pressure generating chamber 12, the end of the piezoelectric layer 70 is positioned inside the end of the first electrode 60 (closer to the pressure generating chamber 12).

Note that a lead electrode 90 made of, for example, gold (Au) and so forth connects to the first electrode 60 extending outside the piezoelectric layer 70. Although not illustrated, the lead electrode 90 constitutes a terminal section to which a connection wire linking to a drive circuit and so forth is connected.

Here, piezoelectric materials equivalent to the piezoelectric layer 371 and the piezoelectric layer 372 described above are used for the piezoelectric layer 70 of the piezoelectric element 300A, so that droplets having different sizes can be separately ejected. Note that the piezoelectric layer 371 is made of a piezoelectric material having a d constant greater than that of the second piezoelectric layer 372 and having a relative dielectric constant greater than that of the piezoelectric layer 372, whereas the piezoelectric layer 372 is made of a piezoelectric material having a d constant smaller than that of the piezoelectric layer 371 and having a relative dielectric constant smaller than the piezoelectric layer 371, which is as described above.

In the piezoelectric element 300 of such a configuration, applying voltage between the first electrode 60 and the second electrode 80 causes deformation. That is, by applying voltage between both the electrodes 60 and 80, piezoelectric strain occurs in the piezoelectric layer 70 sandwiched between the first electrode 60 and the second electrode 80. A portion of the piezoelectric layer 70 where piezoelectric strain occurs when voltage is applied between both the electrodes 60 and 80 is referred to as an active portion. In contrast, a portion of the piezoelectric layer 70 where piezoelectric strain does not occur is referred to as a non-active portion. In addition, in the active portion, which is in the piezoelectric layer 70 and where piezoelectric strain occurs, a portion facing the pressure generating chamber 12 is referred to a flexible portion, and a portion outside the pressure generating chamber 12 is referred to as a non-flexible portion.

In this embodiment, all the first electrodes 60, the piezoelectric layer 70, and the second electrode 80 are continuously disposed to extend outside the pressure generating chambers 12 in the second direction Y of the pressure generating chambers 12. That is, the active portions are continuously disposed to extend outside the pressure generating chambers 12. For this reason, in the active portions, portions facing the pressure generating chambers 12 of the piezoelectric element 300 are flexible portions, and portions outside the pressure generating chambers 12 are inflexible portions.

As illustrated in FIG. 6A and FIG. 6B, a protection substrate 30 for protecting the piezoelectric element 300A is bonded onto the flow path forming substrate 10 on which such the piezoelectric element 300A is formed, by an adhesive 35.

The protecting substrate 30 is provided with a piezoelectric element holding section 31, which is a recess defining a space for containing the piezoelectric element 300. The protecting substrate 30 is provided with a manifold section 32 constituting part of the manifold 100. The manifold section 32 is formed in such a manner as to pass through the protecting substrate 30 in the thickness direction thereof and as to spread over the cross direction of the pressure generating chambers 12, and communicates with the communicating section 15 of the flow path forming substrate 10 as described above. The protecting substrate 30 is also provided with a through-hole 33 that passes through the protecting substrate 30 in the thickness direction thereof. The lead electrode 90 connecting to the first electrode 60 of each active portion is exposed in the through-hole 33, and one end of the connection wire connecting to a drive circuit, which is not illustrated, connects to the lead electrode 90 in the through-hole 33.

A compliance substrate 40 including a sealing film 41 and a fixed board 42 is bonded onto the protecting substrate 30. The sealing film 41 is made of a material having low rigidity and having flexibility. One side of the manifold section 32 is sealed with the sealing film 41. The fixed board 42 is made of a hard material, such as metal. The area facing the manifold 100 of the fixed board 42 is an opening 43 in which the fixed board 42 is completely removed in the thickness direction thereof. Therefore, one side of the manifold 100 is sealed only with the sealing film 41 having flexibility.

In the ink jet recording head I of this embodiment having such a configuration, ink is taken in from an ink introduction port connecting to an external ink feed unit, which is not illustrated, and after the inside extending from the manifold 100 to the nozzle openings 21 is filled with ink, voltage is applied between each of the first electrodes 60 corresponding to the pressure generating chamber 12 and the second electrode 80, in accordance with recording signals from the drive circuit. Thereby, the diaphragm 50 bends and deforms together with the piezoelectric element 300, thereby increasing the pressure in each pressure generating chamber 12. As a result, ink droplets are ejected from each nozzle opening 21.

Figure 8:
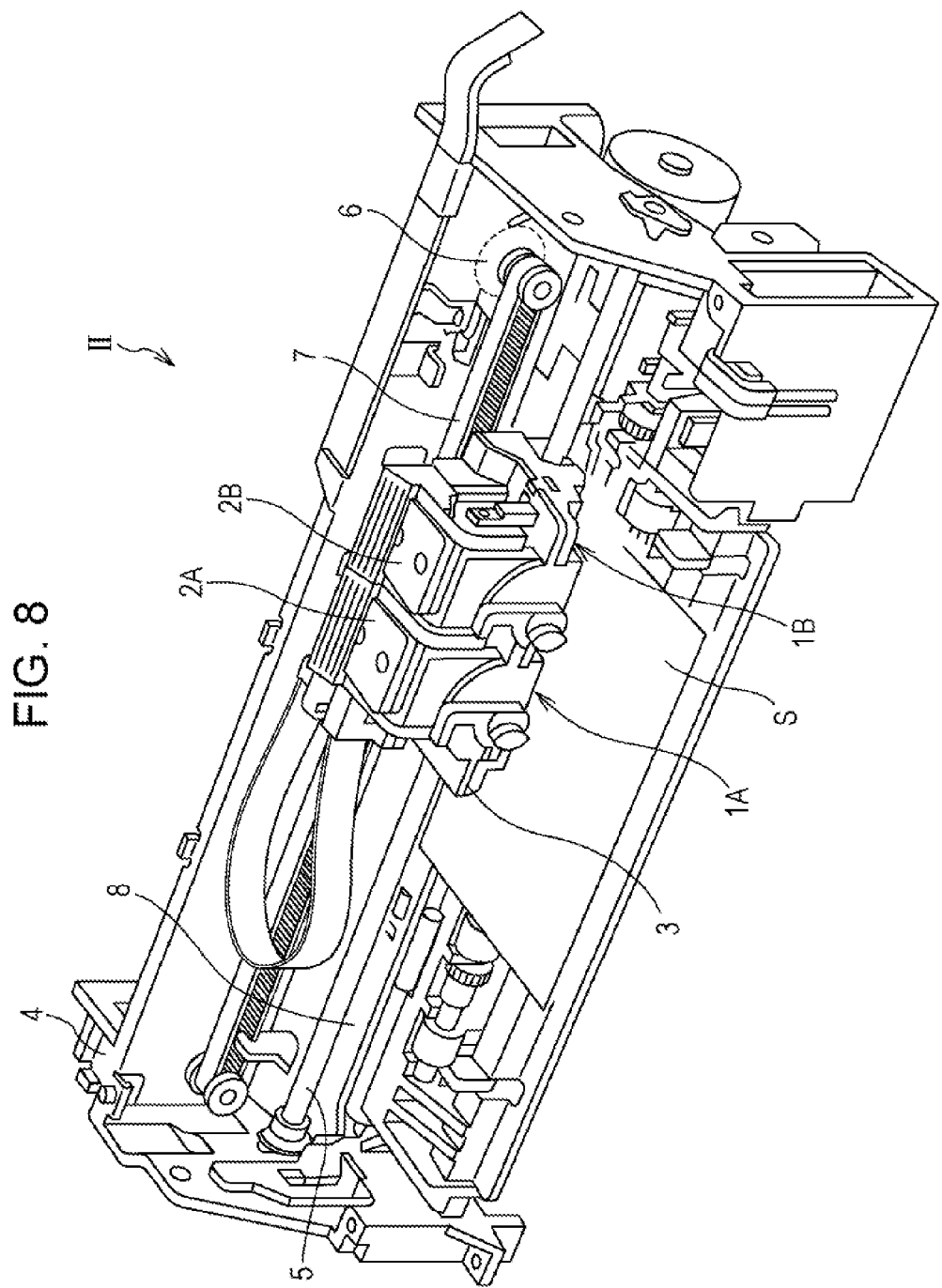
FIG. 8 is a schematic view of a recording apparatus according to the embodiment of the invention.

The ink jet recording head I of this embodiment is mounted, for example, in an ink jet recording apparatus II as illustrated in FIG. 8. In a recording head unit 1 having the ink jet recording head I, an ink cartridge 2 constituting an ink supply unit is removably provided, and a carriage 3 on which the recording head unit 1 is mounted is provided on a carriage axis 5 attached to an apparatus body 4 in such a manner as to be axially movable. The recording head unit 1 ejects a black ink composition and a color ink composition, for example.

The driving force of a drive motor 6 is transmitted through a plurality of gears, which are not illustrated, and a timing belt 7 to the carriage 3, thereby causing the carriage 3 having the recording head unit 1 mounted thereon to move along the carriage axis 5. In the apparatus body 4, a platen 8 is provided along the carriage axis 5, and a recording sheet S, which is a recording medium, such as paper, fed by using a feed roller and so forth, which are not illustrated, is wrapped around the platen 8 and is transported.

In the invention, the piezoelectric elements 300 of a plurality of kinds having different characteristics, which constitute the ink jet recording head I, are provided as described above. Thus, droplets having different sizes can be separately ejected without changing the drive waveform. As a result, the ink jet recording apparatus II with improved printing quality and increased durability can be realized.

Note that, although the ink jet recording apparatus in which the ink jet recording head I mounted on the carriage 3 moves in the primary scanning direction has been exemplified as the ink jet recording apparatus II, the configuration thereof is not limited. The ink jet recording apparatus II may be, for example, a so-called line-type recording apparatus in which the ink jet recording head I is fixed, and printing is performed by moving the recording sheet S, such as paper, in the sub-scanning direction.

Additionally, although, in the example described above, the ink jet recording apparatus II has a configuration in which the ink cartridge 2, which is a liquid reservoir unit, is mounted on the carriage 3, the configuration is not limited to this. For example, the liquid reservoir unit such as an ink tank may be fixed to the apparatus body 4, and the reservoir unit and the ink jet recording head I may be connected through a supply pipe such as a tube. The reservoir unit need not be mounted on the ink jet recording apparatus.

Other Embodiments

The embodiment of the invention has been described above. However, the basic configuration of the invention is not limited to that described above.

The invention may be applied to not only ultrasonic devices and liquid ejecting heads (ink jet recording heads) but also actuator devices that can be mounted on all apparatuses and various sensors using piezoelectric elements.

Additionally, although, in the above embodiment, the invention has been described taking an ink jet recording head as an example of a liquid ejecting head, the invention is broadly intended for liquid ejecting heads in general. Examples of liquid ejecting heads include, in addition to various recording heads used for image recording apparatuses such as a printer, a coloring material ejecting head used for manufacturing a color filter of a liquid crystal display or the like, an electrode material ejecting head used for forming an electrode of an organic electroluminescent (EL) display, a field emission display (FED), or the like, and a living body organic matter ejecting head used for bio-chip manufacture.

The entire disclosure of Japanese Patent Application No. 2013-070722, filed Mar. 28, 2013 is incorporated by reference herein.

What is claimed is:

1. A piezoelectric element module comprising:
a first piezoelectric element having a first piezoelectric layer; and
a second piezoelectric element having a second piezoelectric layer different from the first piezoelectric layer, the first piezoelectric element and the second piezoelectric element being on the same substrate, wherein the first piezoelectric element is spaced apart and separate from the second piezoelectric element,
wherein the first piezoelectric layer has a d constant greater than a d constant of the second piezoelectric layer.

2. The piezoelectric element module according to claim 1, wherein the first piezoelectric element and the second piezoelectric element are arranged side by side in the same plane.

3. An ultrasonic transducer comprising the piezoelectric element module according to claim 2,
wherein the first piezoelectric layer has a g constant smaller than a g constant of the second piezoelectric layer,
the first piezoelectric element is a transmitting unit, and
the second piezoelectric element is a receiving unit.

4. An ultrasonic device comprising:
a substrate having an opening; and
the ultrasonic transducer according to claim 3 provided on the substrate.

5. A liquid ejecting head comprising:
a flow path forming substrate having therein a pressure generating chamber communicating with a nozzle opening that ejects liquid; and the piezoelectric element module according to claim 2 provided on the flow path forming substrate.

6. A liquid ejecting apparatus comprising the liquid ejecting head according to claim 4.

7. An ultrasonic transducer comprising the piezoelectric element module according to claim 1,
- wherein the first piezoelectric layer has a g constant smaller than a g constant of the second piezoelectric layer,
- the first piezoelectric element is a transmitting unit, and
- the second piezoelectric element is a receiving unit.

8. An ultrasonic device comprising:
- a substrate having an opening; and
- the ultrasonic transducer according to claim 7 provided on the substrate.

9. A liquid ejecting head comprising:
- a flow path forming substrate having therein a pressure generating chamber communicating with a nozzle opening that ejects liquid; and
- the piezoelectric element module according to claim 1 provided on the flow path forming substrate.

10. A liquid ejecting apparatus comprising the liquid ejecting head according to claim 9.

\* \* \* \* \*